United States Patent
Sun et al.

(10) Patent No.: US 9,899,454 B2
(45) Date of Patent: Feb. 20, 2018

(54) MANUFACTURING METHOD OF PIXEL STRUCTURE OF ORGANIC LIGHT-EMITTING DIODE DISPLAY PANEL

(71) Applicant: Chunghwa Picture Tubes, LTD., Taoyuan (TW)

(72) Inventors: Yi-Chun Sun, Taipei (TW); Chih-Hao Lin, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 41 days.

(21) Appl. No.: 15/165,525

(22) Filed: May 26, 2016

(65) Prior Publication Data

US 2017/0317147 A1  Nov. 2, 2017

(30) Foreign Application Priority Data

Apr. 27, 2016 (CN) .......................... 2016 1 0269206

(51) Int. Cl.
*H01L 51/56* (2006.01)
*H01L 27/32* (2006.01)
*H01L 51/00* (2006.01)
*H01L 51/52* (2006.01)

(52) U.S. Cl.
CPC ........ *H01L 27/3211* (2013.01); *H01L 51/001* (2013.01); *H01L 51/0011* (2013.01); *H01L 51/5206* (2013.01); *H01L 51/5265* (2013.01); *H01L 51/56* (2013.01); *H01L 2251/558* (2013.01)

(58) Field of Classification Search
CPC ........................................................ H01L 51/56
See application file for complete search history.

(56) References Cited

U.S. PATENT DOCUMENTS

2015/0340410 A1\* 11/2015 Hack .................. H01L 51/5265
257/40

FOREIGN PATENT DOCUMENTS

KR   20110059167   6/2011

\* cited by examiner

*Primary Examiner* — Peniel M Gumedzoe
*Assistant Examiner* — Christopher Johnson
(74) *Attorney, Agent, or Firm* — J.C. Patents (57) ABSTRACT

The invention provides a manufacturing method of a pixel structure of an organic light-emitting diode display panel. First transparent anodes located in first pixel regions and fifth pixel regions, second transparent anodes located in second pixel regions and sixth pixel regions, and third transparent anodes located in third pixel regions and fourth pixel regions are formed on a substrate. A first organic light-emitting layer is formed inside the third pixel regions and the fourth pixel regions via a first fine metal mask. A second organic light-emitting layer is formed inside the fifth pixel regions, the sixth pixel regions, the first pixel regions, and the second pixel regions via a second fine metal mask. First cathodes, second cathodes, and third cathodes are formed on the substrate.

10 Claims, 5 Drawing Sheets

MANUFACTURING METHOD OF PIXEL STRUCTURE OF ORGANIC LIGHT-EMITTING DIODE DISPLAY PANEL

CROSS-REFERENCE TO RELATED APPLICATION

This application claims the priority benefit of China application serial no. 201610269206.3, filed on Apr. 27, 2016. The entirety of the above-mentioned patent application is hereby incorporated by reference herein and made a part of this specification.

BACKGROUND OF THE INVENTION

Field of the Invention

The invention relates to a manufacturing method of a pixel structure of a light-emitting diode display panel, and more particularly, to a manufacturing method of a pixel structure of an organic light-emitting diode display panel.

Description of Related Art

Traditionally, the manufacture of an organic light-emitting diode panel includes isolating different pixel regions using a fine metal mask (FMM) and achieving an arrangement method of red, green, and blue via evaporation. Currently, the main pixel arrangement method includes arranging red pixels, green pixels, and blue pixels in repeating stripes, and the opening size of an FMM is generally between 25 micrometers and 30 micrometers, but the width of a high resolution (pixel per inch (ppi) reaching 400 ppi or more) pixel structure is about 21 micrometers or less, and therefore the evaporation manufacturing method of a high resolution organic light-emitting diode panel cannot achieve an opening size of 25 micrometers or less due to the FMM. As a result, the manufacture of a high resolution panel of 400 ppi or more cannot be achieved via the current FMM.

SUMMARY OF THE INVENTION

An object of the invention is to provide a manufacturing method of a pixel structure of an organic light-emitting diode display panel capable of reducing the usage quantity of fine metal masks and capable of increasing aperture ratio and resolution.

To achieve the above object, the manufacturing method of a pixel structure of an organic light-emitting diode display panel of the invention includes the following manufacturing steps. A substrate is provided. The substrate defines a plurality of first pixel regions, a plurality of second pixel regions, a plurality of third pixel regions, a plurality of fourth pixel regions, a plurality of fifth pixel regions, and a plurality of sixth pixel regions arranged in order. A plurality of first transparent anodes, a plurality of second transparent anodes, and a plurality of third transparent anodes are foil led on the substrate. The first transparent anodes are located in the first pixel regions and the fifth pixel regions. The second transparent anodes are located in the second pixel regions and the sixth pixel regions. The third transparent anodes are located in the third pixel regions and the fourth pixel regions. The first transparent anodes and the second transparent anodes have different thicknesses. A first organic light-emitting layer is formed inside the third pixel regions and the fourth pixel regions via a first fine metal mask. A second organic light-emitting layer is formed inside the fifth pixel regions, the sixth pixel regions, the first pixel regions, and the second pixel regions via a second fine metal mask. A plurality of first cathodes, a plurality of second cathodes, and a plurality of third cathodes are formed on the substrate. The first cathodes are located in the first pixel regions and the fifth pixel regions. The second cathodes are located in the second pixel regions and the sixth pixel regions. The third cathodes are located in the third pixel regions and the fourth pixel regions. The thicknesses of the first cathodes, the second cathodes, and the third cathodes are the same. A plurality of first micro-resonant chambers is formed between the first transparent anodes and the first cathodes to generate a first primary color in the first pixel regions and the fifth pixel regions. A plurality of second micro-resonant chambers is formed between the second transparent anodes and the second cathodes to generate a second primary color in the second pixel regions and the sixth pixel regions. A plurality of third micro-resonant chambers is formed between the third transparent anodes and the third cathodes to generate a third primary color in the third pixel regions and the fourth pixel regions.

In an embodiment of the invention, the first organic light-emitting layer is a blue light-emitting material and the second organic light-emitting layer is a yellow light-emitting material.

In an embodiment of the invention, the thickness of the first transparent anodes is greater than the thickness of the second transparent anodes.

In an embodiment of the invention, the first organic light-emitting layer is a red light-emitting material and the second organic light-emitting layer is a light green light-emitting material.

In an embodiment of the invention, the thickness of the first transparent anodes is greater than the thickness of the second transparent anodes.

In an embodiment of the invention, the first organic light-emitting layer is a green light-emitting material and the second organic light-emitting layer is a purple light-emitting material.

In an embodiment of the invention, the thickness of the second transparent anodes is greater than the thickness of the first transparent anodes.

In an embodiment of the invention, the manufacturing method of a pixel structure of an organic light-emitting diode display panel further includes: forming a hole injection layer inside the first pixel regions, the second pixel regions, the third pixel regions, the fourth pixel regions, the fifth pixel regions, and the sixth pixel regions before the first organic light-emitting layer and the second organic light-emitting layer are formed; and forming a hole transport layer on the hole injection layer after the hole injection layer is formed.

In an embodiment of the invention, the manufacturing method of a pixel structure of an organic light-emitting diode display panel further includes: forming an electron transport layer on the first organic light-emitting layer and the second organic light-emitting layer on the electron transport layer after the first organic light-emitting layer and the second organic light-emitting layer are formed and before the first cathodes, the second cathodes, and the third cathodes are formed; and forming an electron injection layer on the electron transport layer after the electron transport layer is formed.

In an embodiment of the invention, the manufacturing method of a pixel structure of an organic light-emitting diode display panel further includes: forming an electron blocking layer on the hole transport layer after the hole transport layer is formed and before the first organic light-emitting layer and the second organic light-emitting layer are formed; and forming a hole blocking layer on the first organic light-emitting layer and the second organic light-emitting layer after the first organic light-emitting layer and the second organic light-emitting layer are formed and before the electron transport layer is formed.

Based on the above, the manufacturing method of the pixel structure of the organic light-emitting diode display panel of the invention can generate three different primary colors by using only two different organic light-emitting layers by a micro-resonant effect via the thickness difference and the arrangement method of the first transparent anodes, the second transparent anodes, and the third transparent anodes. Therefore, in addition to reducing the usage quantity of the fine metal mask to lower manufacturing cost, the manufacturing method of the pixel structure of the organic light-emitting diode display panel of the invention can also effectively increase the aperture ratio and the resolution.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Hereinafter, exemplary embodiments of the invention are described in detail, and examples of the exemplary embodiment are provided via the figures. Whenever possible, the same reference numerals are used in the drawings and the descriptions to refer to the same or similar portions.

Figure 1A:
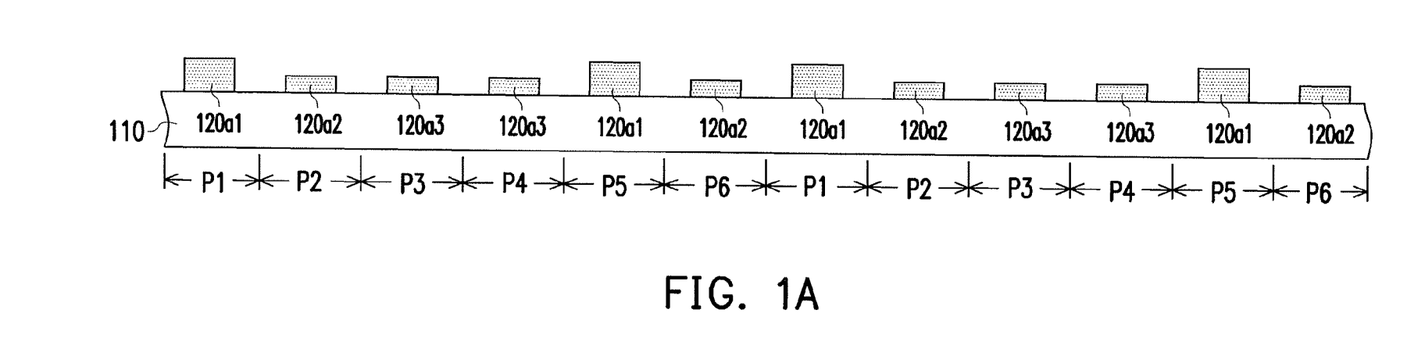
FIG. 1A to FIG. 1F show cross-sectional schematics of the manufacturing method of a pixel structure of an organic light-emitting diode display panel of an embodiment of the invention.
Figure 1B:
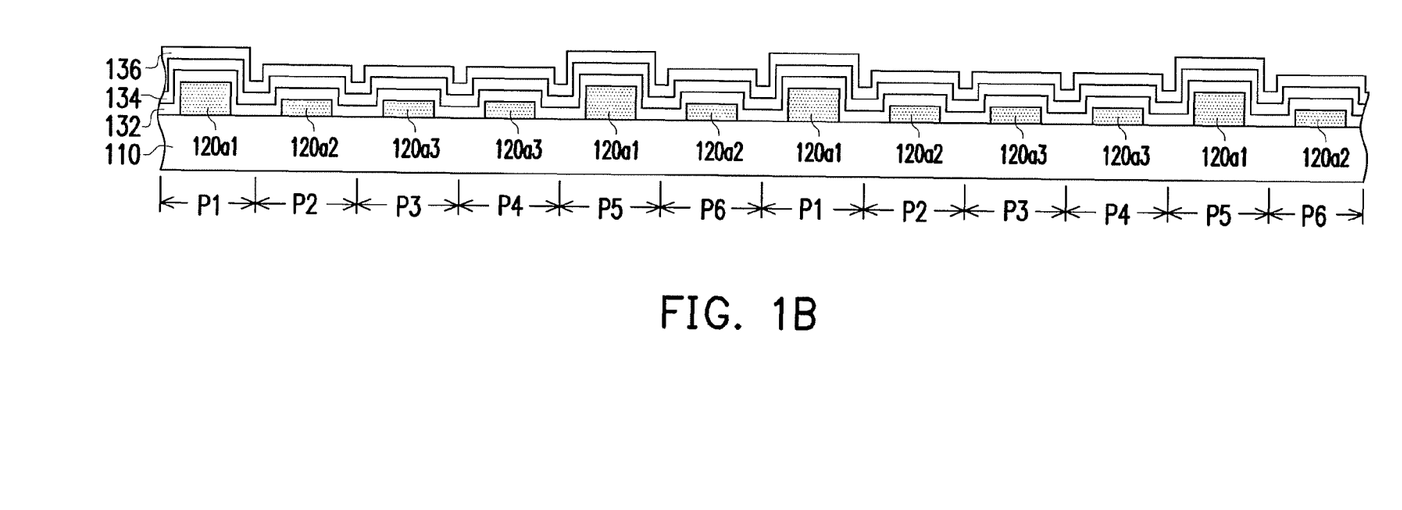

FIG. 1A to FIG. 1F show cross-sectional schematics of the manufacturing method of a pixel structure of an organic light-emitting diode display panel of an embodiment of the invention. Referring first to FIG. 1A, in the manufacturing method of a pixel structure of an organic light-emitting diode display panel of the present embodiment, first, a substrate 110 is provided, wherein the substrate 110 defines a plurality of first pixel regions P1, a plurality of second pixel regions P2, a plurality of third pixel regions P3, a plurality of fourth pixel regions P4, a plurality of fifth pixel regions P5, and a plurality of sixth pixel regions P6 arranged in order. As shown in FIG. 1, the first pixel regions P1, the second pixel regions P2, the third pixel regions P3, the fourth pixel regions P4, the fifth pixel regions P5, and the sixth pixel regions P6 of the present embodiment are repeatedly arranged in order along a direction.

Then, referring further to FIG. 1A, a plurality of first transparent anodes 120a1, a plurality of second transparent anodes 120a2, and a plurality of third transparent anodes 120a3 are formed on the substrate 110, wherein the first transparent anodes 120a1 are located in the first pixel regions P1 and the fifth pixel regions P5, the second transparent anodes 120a2 are located in the second pixel regions P2 and the sixth pixel regions P6, the third transparent anodes 120a3 are located in the third pixel regions P3 and the fourth pixel regions P4, and the first transparent anodes 120a1 and the second transparent anodes 120a2 have different thicknesses.

Specifically, the material of the first transparent anodes 120a1, the second transparent anodes 120a2, and the third transparent anodes 120a3 is, for instance, indium tin oxide (ITO) having conductivity. As shown in FIG. 1A, in the present embodiment, the thickness of the first transparent anodes 120a1 is greater than the thickness of the second transparent anodes 120a2, and the thickness of the second transparent anodes 120a2 is the same as the thickness of the third transparent anodes 120a3. In other words, one of the first transparent anodes 120a1, the second transparent anodes 120a2, and the third transparent anodes 120a3 has a different thickness than the other two. Here, the first transparent anodes 120a1, the second transparent anodes 120a2, and the third transparent anodes 120a3 are, for instance, formed on the substrate 110 via the lithography process of an active device array substrate. Then, referring to FIG. 1B, a hole injection layer 132, a hole transport layer 134, and an electron blocking layer 136 are formed on the substrate 110 in order, wherein the hole injection layer 132 is formed inside the first pixel regions P1, the second pixel regions P2, the third pixel regions P3, the fourth pixel regions P4, the fifth pixel regions P5, and the sixth pixel regions P6 of the substrate 110, and at least covers the first transparent anodes 120a1, the second transparent anodes 120a2, and the third transparent anodes 120a3. The hole transport layer 134 is disposed on and covers the hole injection layer 132, and the electron blocking layer 136 is disposed on and covers the hole transport layer 134, wherein the hole injection layer 132 can reduce the interfacial energy barrier between a light-emitting layer (i.e., organic light-emitting layer) formed subsequently and the first transparent anodes 120a1, the second transparent anodes 120a2, and the third transparent anodes 120a3 such that the device has better luminous efficiency and lower driving voltage, and the object of the electron blocking layer 136 is to balance the number of electrons and holes so as to improve the capture and composite capabilities of carriers, and the light-emitting characteristics of the device can also be improved. Here, the forming method of the hole injection layer 132, the hole transport layer 134, and the electron blocking layer 136 includes, for instance, a thermal evaporation process.

Figure 1C:
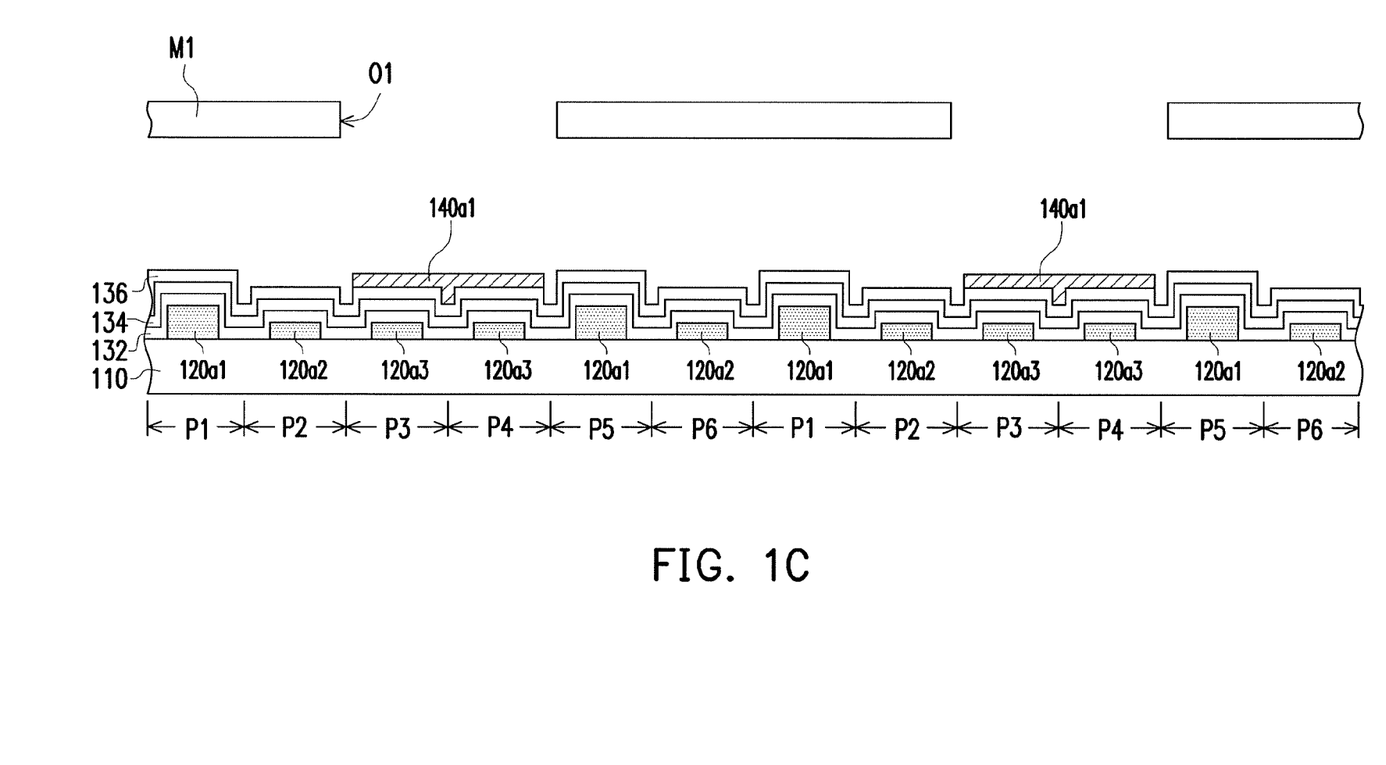

Then, referring to FIG. 1C, a first organic light-emitting layer 140a1 is formed inside the third pixel regions P3 and the fourth pixel regions P4 via a first fine metal mask M1. Here, the first organic light-emitting layer 140a1 is a blue light-emitting material, i.e., a single layer of a single material. As shown in FIG. 1C, the first fine metal mask M1 has a plurality of first openings O1, the first openings O1 expose the third pixel regions P3 and the fourth pixel regions P4 in which the third transparent anodes 120a3 are located, and the aperture of each of the first openings O1 is between 25 micrometers and 30 micrometers. The first organic light-emitting layer 140a1 is formed inside the third pixel regions P3 and the fourth pixel regions P4 in which the third transparent anodes 120a3 are located via an evaporation process using the first fine metal mask M1. At this point, the width of the pixel structure inside the third pixel regions P3 and the fourth pixel regions P4 can respectively be about 12.5 micrometers to 15 micrometers.

Figure 1D:
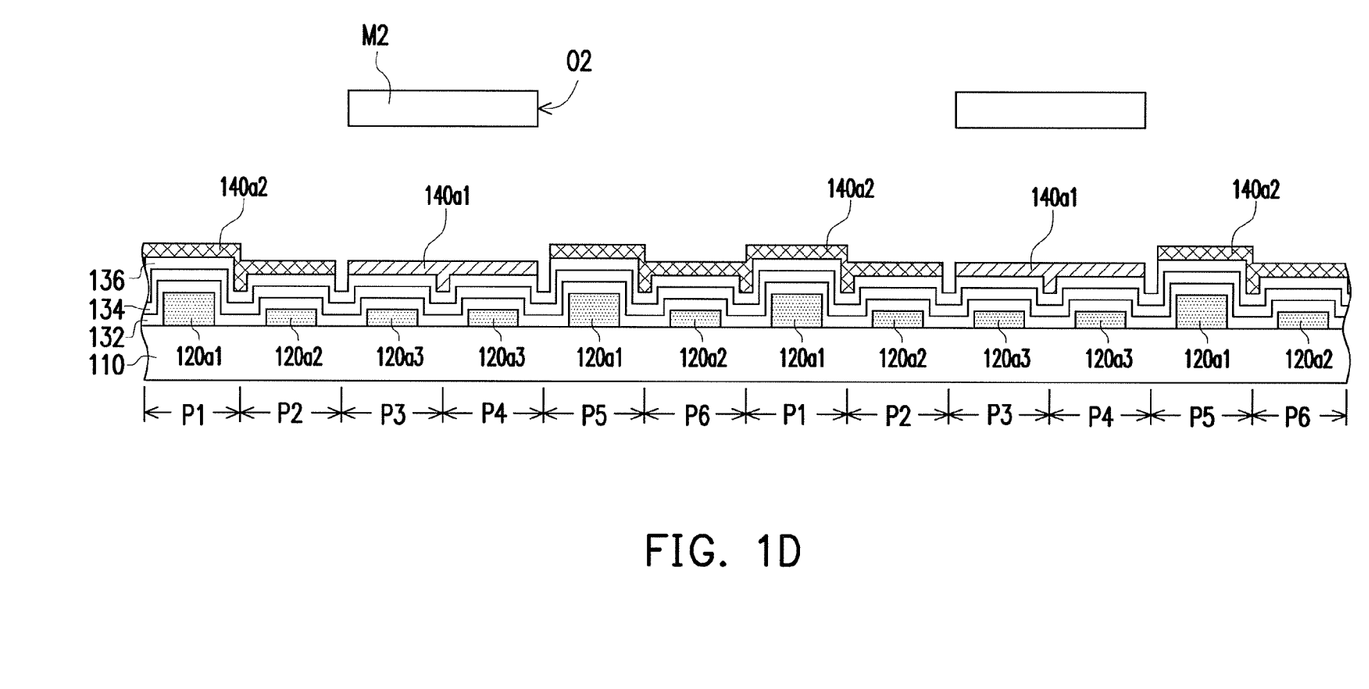

Then, referring to FIG. 1D, the first fine metal mask M1 is removed, and a second organic light-emitting layer 140a2 is formed inside the fifth pixel regions P5, the sixth pixel regions P6, the first pixel regions P1, and the second pixel regions P2 via a second fine metal mask M2. Here, the second organic light-emitting layer 140a2 is a yellow light-emitting material, i.e., a single layer of a single material. As shown in FIG. 1D, the second fine metal mask M2 has a plurality of second openings O2, the first openings O2 expose the first pixel regions P1, the fifth pixel regions P5, the second pixel regions P2, and the sixth pixel regions P6 in which the first transparent anodes 120a1 and the second transparent anodes 120a2 are located, and the aperture of each of the second openings O2 is between 25 micrometers and 30 micrometers. The second organic light-emitting layer 140a2 is formed inside the first pixel regions P1, the fifth pixel regions P5, the second pixel regions P2, and the sixth pixel regions P6 in which the first transparent anodes 120a1 and the second transparent anodes 120a2 are located via an evaporation process of the second fine metal mask M2. At this point, the width of the pixel structure of the first pixel regions P1, the fifth pixel regions P5, the second pixel regions P2, and the sixth pixel regions P6 can respectively be about 6.25 micrometers to 7.5 micrometers.

Figure 1E:
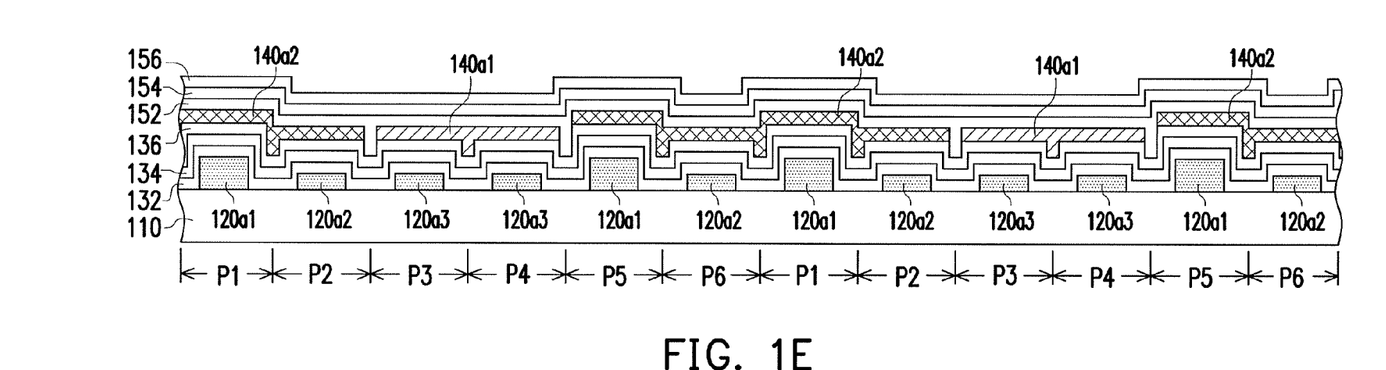

Then, referring to FIG. 1E, the second fine metal mask M2 is removed, and a hole blocking layer 152, an electron transport layer 154, and an electron injection layer 156 are formed on the substrate 110 in order, wherein the hole blocking layer 152 covers the first organic light-emitting layer 140a1 and the second organic light-emitting layer 140a2, the electron transport layer 154 covers the hole blocking layer 152, and the electron injection layer 156 covers the electron transport layer 154. The electron injection layer 156 can reduce the interfacial energy barrier between the first organic light-emitting layer 140a1 and the second organic light-emitting layer 140a2 and an electrode layer (i.e., cathode) formed subsequently, such that the device has better luminous efficiency and lower driving voltage, and the object of the hole blocking layer 152 is to balance the number of electrons and holes so as to improve the capture and composite capabilities of carriers, and the light-emitting characteristics of the device can also be improved. Here, the forming method of the hole blocking layer 152, the hole transport layer 154, and the electron injection layer 156 includes, for instance, a thermal evaporation process.

Figure 1F:
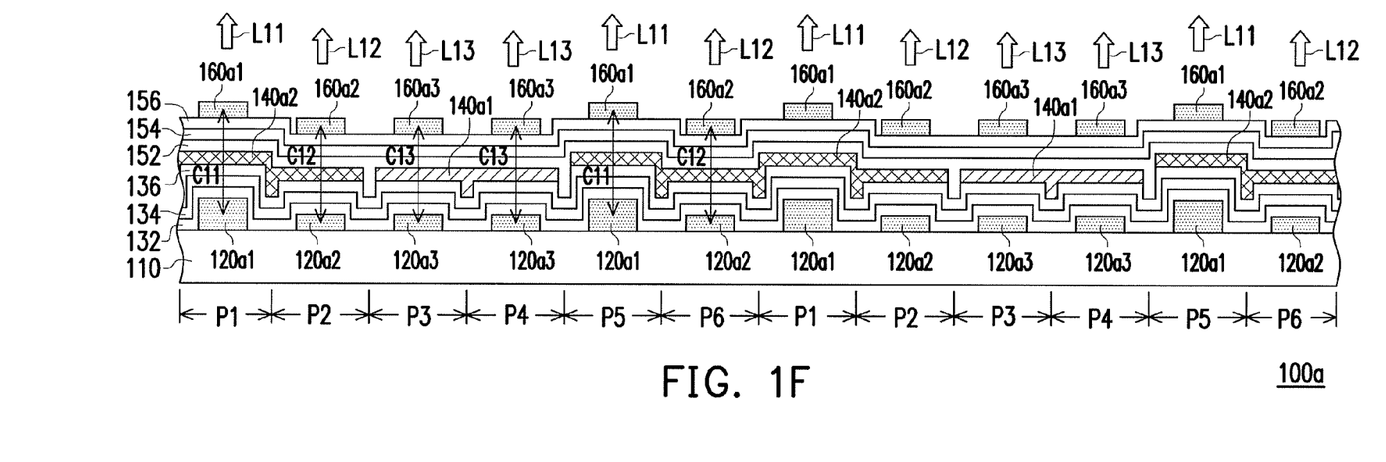

Lastly, referring to FIG. 1F, a plurality of first cathodes 160a1, a plurality of second cathodes 160a2, and a plurality of third cathodes 160a3 are formed on the substrate 110. The first cathodes 160a1 are located in the first pixel regions P1 and the fifth pixel regions P5, the second cathodes 160a2 are located in the second pixel regions P2 and the sixth pixel regions P6, the third cathodes 160a3 are located in the third pixel regions P3 and the fourth pixel regions P4, and the thicknesses of the first cathodes 160a1, the second cathodes 160a2, and the third cathodes 160a3 are the same. Here, the first cathodes 160a1, the second cathodes 160a2, and the third cathodes 160a3 are, for instance, formed on the substrate 110 via the lithography process of an active device array substrate. At this point, the manufacture of a pixel structure 100a of an organic light-emitting diode display panel is complete.

At this point, referring further to FIG. 1F, a plurality of first micro-resonant chambers C11 is formed between the first transparent anodes 120a1 and the first cathodes 160a1, and a plurality of second micro-resonant chambers C12 is formed between the second transparent anodes 120a2 and the second cathodes 160a2, wherein the thickness of the first transparent anodes 120a1 is greater than the thickness of the second transparent anodes 120a2, and therefore the resonant chamber length of the first micro-resonant chambers C11 is also greater than the resonant chamber length of the second micro-resonant chambers C12. In general, the greater the length of the resonance chamber, the longer the wavelength of the generated light. Therefore, when display is to be performed, via a micro-resonant chamber effect, a first primary color L11 (red) generated by the second organic light-emitting layer 140a2 (i.e., yellow light-emitting material) can be emitted out of the first pixel regions P1 and the fifth pixel regions P5, but cannot be emitted out of the second pixel regions P2 and the sixth pixel regions P6, and a second primary color L12 (green) generated by the second organic light-emitting layer 140a2 can be emitted out of the second pixel regions P2 and the sixth pixel regions P6, but cannot be emitted out of the first pixel regions P1 and the fifth pixel regions P5. Moreover, a plurality of third micro-resonant chambers C13 is formed between the third transparent anodes 120a3 and the third cathodes 160a3, and via a micro-resonant chamber effect, a third primary color L13 (blue) generated by the first organic light-emitting layer 140a1 (i.e., blue light-emitting material) can be emitted out of the third pixel regions P3 and the fourth pixel regions P4.

In short, the manufacturing method of the pixel structure 100 of an organic light-emitting diode display panel of the present embodiment can generate three different primary colors (i.e., red, green, and blue) using the first organic light-emitting layer 140a1 and the second organic light-emitting layer 140a2 of two different colors via a micro-resonant effect by making the thickness of the first transparent anodes 120a1 greater than the thickness of the second transparent anodes 120a2 and via the arrangement method of the first transparent anodes 120a1, the second transparent anodes 120a2, and the third transparent anodes 120a3. Therefore, the manufacturing method of the pixel structure 100a of an organic light-emitting diode display panel of the present embodiment can reduce the usage quantity of the fine metal mask (i.e., only the first fine metal mask M1 and a second fine metal mask M2 are needed) so as to reduce manufacturing cost. In addition, in comparison to the evaporation manufacturing method of the current organic light-emitting diode display panel in which a pixel structure having a width of 25 micrometers or less cannot be manufactured due to the fine metal mask, the pixel structure 100a of an organic light-emitting diode display panel manufactured in the present embodiment can respectively be about 6.25 micrometers to 7.5 micrometers inside the first pixel regions P1, the fifth pixel regions P5, the second pixel regions P2, and the sixth pixel regions P6, and the width thereof inside the third pixel regions P3 and the fourth pixel regions P4 can respectively be about 12.5 micrometers to 15 micrometers. Therefore, the pixel structure 100a of an organic light-emitting diode display panel manufactured in the present embodiment can have the efficacies of increased aperture ratio and high resolution. Moreover, via a micro-resonant effect, the pixel structure 100a of an organic light-emitting diode display panel of the present embodiment can generate the first primary color L11 (red), the second primary color L12 (green), and the third primary color L13 (blue) highly distinguishable from one another without a color filter, and can effectively increase color saturation.

It should be mentioned here that, the following embodiments adopt the reference numerals of the embodiments above and a portion of the contents thereof, wherein the same numerals are used to represent the same or similar devices and descriptions of the same technical contents are omitted. The omitted portions are as described in the embodiments above and are not repeated in the embodiments below.

Figure 2:
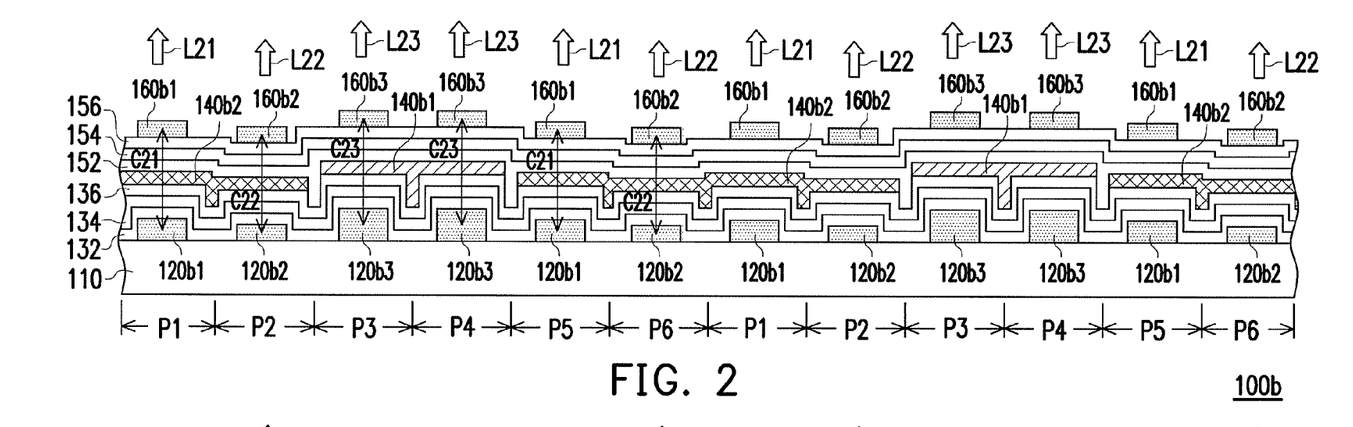
FIG. 2 shows a cross-sectional schematic of a pixel structure of another organic light-emitting diode display panel of an embodiment of the invention.

FIG. 2 shows a cross-sectional schematic of a pixel structure of another organic light-emitting diode display panel of an embodiment of the invention. Referring to FIG. 2, a pixel structure 100b of an organic light-emitting diode display panel of the present embodiment is similar to the pixel structure 100a of an organic light-emitting diode display panel of FIG. 1F, and two main differences are: in the present embodiment, the thickness of first transparent anodes 120b1 is greater than the thickness of second transparent anodes 120b2, and the thickness of third transparent anodes 120b3 is greater than the thickness of the first transparent anodes 120b1 and the thickness of the second transparent anodes 120b2. Moreover, a first organic light-emitting layer 140b1 of the present embodiment is a red light-emitting material and a second organic light-emitting layer 140b2 is a light green light-emitting material.

Therefore, first micro-resonant chambers C21 are formed between the first transparent anodes 120b1 and the first cathodes 160b1, and second micro-resonant chambers C22 are formed between the second transparent anodes 120b2 and the second cathodes 160b2, wherein the thickness of the first transparent anodes 120b1 is greater than the thickness of the second transparent anodes 120b2, and therefore the resonant chamber length of the first micro-resonant chambers C21 is also greater than the resonant chamber length of the second micro-resonant chambers C22. Therefore, when display is to be performed, via a micro-resonant chamber effect, a first primary color L21 (green) generated by the second organic light-emitting layer 140b2 (i.e., light green light-emitting material) can be emitted out of the first pixel regions P1 and the fifth pixel regions P5, but cannot be emitted out of the second pixel regions P2 and the sixth pixel regions P6, and a second primary color L22 (blue) generated by the second organic light-emitting layer 140b2 can be emitted out of the second pixel regions P2 and the sixth pixel regions P6, but cannot be emitted out of the first pixel regions P1 and the fifth pixel regions P5. Moreover, third micro-resonant chambers C23 are formed between the third transparent anodes 120b3 and the third cathodes 160b3, and via a micro-resonant chamber effect, a third primary color L23 (red) generated by the first organic light-emitting layer 140b1 (i.e., red light-emitting material) can be emitted out of the third pixel regions P3 and the fourth pixel regions P4.

Figure 3:
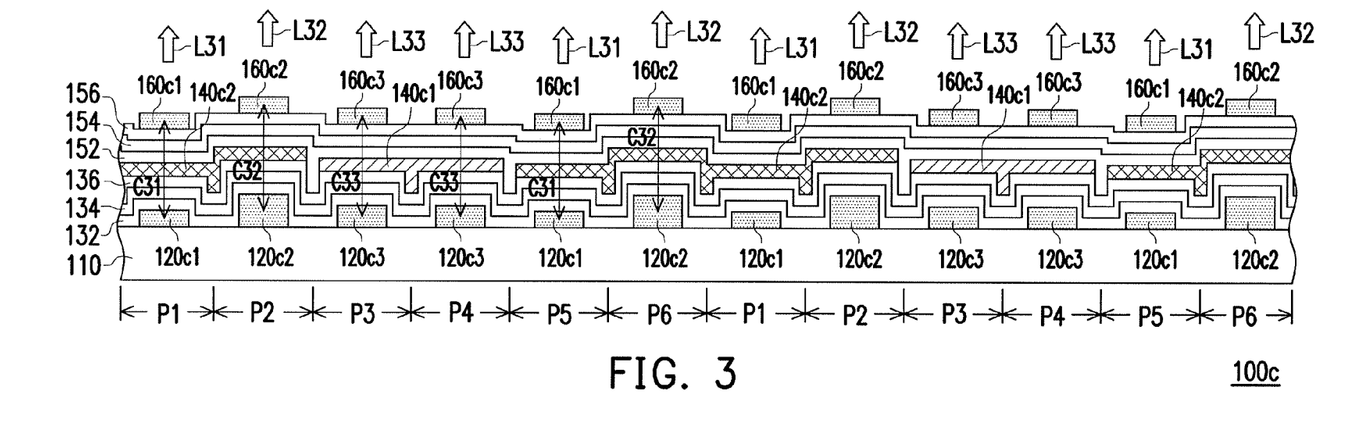
FIG. 3 shows a cross-sectional schematic of a pixel structure of another organic light-emitting diode display panel of an embodiment of the invention.

FIG. 3 shows a cross-sectional schematic of a pixel structure of another organic light-emitting diode display panel of an embodiment of the invention. Referring to FIG. 3, a pixel structure 100c of an organic light-emitting diode display panel of the present embodiment is similar to the pixel structure 100a of an organic light-emitting diode display panel of FIG. 1F, and two main differences are: the thickness of second transparent anodes 120c2 of the present embodiment is greater than the thickness of first transparent anodes 120c1, and the thickness of third transparent anodes 120c3 is greater than the thickness of the first transparent anodes 120c1 but is less than the thickness of the second transparent anodes 120c2. Moreover, in the present embodiment, a first organic light-emitting layer 140c1 is a green light-emitting material and a second organic light-emitting layer 140c2 is a purple light-emitting material.

Therefore, first micro-resonant chambers C31 are formed between the first transparent anodes 120c1 and first cathodes 160c1, and second micro-resonant chambers C32 are formed between the second transparent anodes 120c2 and second cathodes 160c2, wherein the thickness of the second transparent anodes 120c2 is greater than the thickness of the first transparent anodes 120c1, and therefore the resonant chamber length of the first micro-resonant chambers C31 is less than the resonant chamber length of the second micro-resonant chambers C32. Therefore, when display is to be performed, via a micro-resonant chamber effect, a first primary color L31 (blue) generated by the second organic light-emitting layer 140c2 (i.e., purple light-emitting material) can be emitted out of the first pixel regions P1 and the fifth pixel regions P5, but cannot be emitted out of the second pixel regions P2 and the sixth pixel regions P6, and a second primary color L32 (red) generated by the second organic light-emitting layer 140c2 can be emitted out of the second pixel regions P2 and the sixth pixel regions P6, but cannot be emitted out of the first pixel regions P1 and the fifth pixel regions P5. Moreover, third micro-resonant chambers C33 are formed between the third transparent anodes 120c3 and third cathodes 160c3, and via a micro-resonant chamber effect, a third primary color L33 (green) generated by the first organic light-emitting layer 140c1 (i.e., green light-emitting material) can be emitted out of the third pixel regions P3 and the fourth pixel regions P4.

Based on the above, the manufacturing method of a pixel structure of an organic light-emitting diode display panel of the invention can generate three different primary colors by using only two different organic light-emitting layers by a micro-resonant effect via the thickness difference and the arrangement method of the first transparent anodes, the second transparent anodes, and the third transparent anodes. Therefore, in addition to reducing the usage quantity of the fine metal mask to lower manufacturing cost, the manufacturing method of a pixel structure of an organic light-emitting diode display panel of the invention can also effectively increase the aperture ratio and the resolution.

Lastly, it should be mentioned that: each of the above embodiments is only used to describe the technical solutions of the invention and is not intended to limit the invention; and although the invention is described in detail via each of the above embodiments, those having ordinary skill in the art should understand that: modifications can still be made to the technical solutions recited in each of the above embodiments, or portions or all of the technical features thereof can be replaced to achieve the same or similar results; the modifications or replacements do not make the nature of the corresponding technical solutions depart from the scope of the technical solutions of each of the embodiments of the invention.

What is claimed is:

1. A manufacturing method of a pixel structure of an organic light-emitting diode display panel, comprising:
   providing a substrate, wherein the substrate defines a plurality of first pixel regions, a plurality of second pixel regions, a plurality of third pixel regions, a plurality of fourth pixel regions, a plurality of fifth pixel regions, and a plurality of sixth pixel regions arranged in order;
   forming a plurality of first transparent anodes, a plurality of second transparent anodes, and a plurality of third transparent anodes on the substrate, wherein the plurality of first transparent anodes is located in the plurality of first pixel regions and the plurality of fifth pixel regions, the plurality of second transparent anodes is located in the plurality of second pixel regions and the plurality of sixth pixel regions, the plurality of third transparent anodes is located in the plurality of third pixel regions and the plurality of fourth pixel regions, and the plurality of first transparent anodes and the plurality of second transparent anodes have different thicknesses;

forming a first organic light-emitting layer inside the plurality of third pixel regions and the plurality of fourth pixel regions via a first fine metal mask;

forming a second organic light-emitting layer inside the plurality of fifth pixel regions, the plurality of sixth pixel regions, the plurality of first pixel regions, and the plurality of second pixel regions via a second fine metal mask; and forming a plurality of first cathodes, a plurality of second cathodes, and a plurality of third cathodes on the substrate, wherein the plurality of first cathodes is located in the plurality of first pixel regions and the plurality of fifth pixel regions, the plurality of second cathodes is located in the plurality of second pixel regions and the plurality of sixth pixel regions, the plurality of third cathodes is located in the plurality of third pixel regions and the plurality of fourth pixel regions, and thicknesses of the plurality of first cathodes, the plurality of second cathodes, and the plurality of third cathodes are the same;

wherein a plurality of first micro-resonant chambers is formed between the plurality of first transparent anodes and the plurality of first cathodes to generate a first primary color in the plurality of first pixel regions and the plurality of fifth pixel regions, and a plurality of second micro-resonant chambers is formed between the plurality of second transparent anodes and the plurality of second cathodes to generate a second primary color in the plurality of second pixel regions and the plurality of sixth pixel regions, and a plurality of third micro-resonant chambers is formed between the plurality of third transparent anodes and the plurality of third cathodes to generate a third primary color in the plurality of third pixel regions and the plurality of fourth pixel regions.

2. The manufacturing method of the pixel structure of the organic light-emitting diode display panel as recited in claim 1, wherein the first organic light-emitting layer is a blue light-emitting material and the second organic light-emitting layer is a yellow light-emitting material.

3. The manufacturing method of the pixel structure of the organic light-emitting diode display panel as recited in claim 2, wherein a thickness of the plurality of first transparent anodes is greater than a thickness of the plurality of second transparent anodes.

4. The manufacturing method of the pixel structure of the organic light-emitting diode display panel as recited in claim 1, wherein the first organic light-emitting layer is a red light-emitting material and the second organic light-emitting layer is a light green light-emitting material.

5. The manufacturing method of the pixel structure of the organic light-emitting diode display panel as recited in claim 4, wherein a thickness of the plurality of first transparent anodes is greater than a thickness of the plurality of second transparent anodes.

6. The manufacturing method of the pixel structure of the organic light-emitting diode display panel as recited in claim 1, wherein the first organic light-emitting layer is a green light-emitting material and the second organic light-emitting layer is a purple light-emitting material.

7. The manufacturing method of the pixel structure of the organic light-emitting diode display panel as recited in claim 6, wherein a thickness of the plurality of second transparent anodes is greater than a thickness of the plurality of first transparent anodes.

8. The manufacturing method of the pixel structure of the organic light-emitting diode display panel as recited in claim 1, further comprising:

forming a hole injection layer inside the plurality of first pixel regions, the plurality of second pixel regions, the plurality of third pixel region, the plurality of fourth pixel regions, the plurality of fifth pixel regions, and the plurality of sixth pixel regions of the substrate before the first organic light-emitting layer and the second organic light-emitting layer are formed; and forming a hole transport layer on the hole injection layer after the hole injection layer is formed.

9. The manufacturing method of the pixel structure of the organic light-emitting diode display panel as recited in claim 8, further comprising:

forming an electron transport layer on the first organic light-emitting layer and the second organic light-emitting layer after the first organic light-emitting layer and the second organic light-emitting layer are formed and before the plurality of first cathodes, the plurality of second cathodes, and the plurality of third cathodes are formed; and forming an electron injection layer on the electron transport layer after the electron transport layer is formed.

10. The manufacturing method of the pixel structure of the organic light-emitting diode display panel as recited in claim 9, further comprising:

forming an electron blocking layer on the hole transport layer after the hole transport layer is formed and before the first organic light-emitting layer and the second organic light-emitting layer are formed; and forming a hole blocking layer on the first organic light-emitting layer and the second organic light-emitting layer after the first organic light-emitting layer and the second organic light-emitting layer are formed and before the electron transport layer is formed.

* * * * *